(12) United States Patent
Iwasaki et al.

(10) Patent No.: US 8,003,981 B2
(45) Date of Patent: Aug. 23, 2011

(54) FIELD EFFECT TRANSISTOR USING OXIDE FILM FOR CHANNEL AND METHOD OF MANUFACTURING THE SAME

(75) Inventors: Tatsuya Iwasaki, Machida (JP); Hideya Kumomi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 12/282,000

(22) PCT Filed: Aug. 3, 2007

(86) PCT No.: PCT/JP2007/055296
§ 371 (c)(1),
(2), (4) Date: Sep. 8, 2008

(87) PCT Pub. No.: WO2007/119386
PCT Pub. Date: Oct. 25, 2007

(65) Prior Publication Data
US 2009/0065771 A1 Mar. 12, 2009

(30) Foreign Application Priority Data
Mar. 17, 2006 (JP) .................................. 2006-074630

(51) Int. Cl.
*H01L 29/12* (2006.01)
(52) U.S. Cl. .................................. 257/43; 257/E29.296
(58) Field of Classification Search .................... 257/43, 257/E29.296
See application file for complete search history.

(56) References Cited

U.S. PATENT DOCUMENTS

| | | | |
|---|---|---|---|
| 5,593,335 A | 1/1997 | Suzuki et al. | 445/50 |
| 5,726,464 A | 3/1998 | Kumomi et al. | 257/103 |
| 6,160,347 A | 12/2000 | Iwasaki et al. | 313/545 |
| 6,283,815 B1 | 9/2001 | Iwasaki et al. | 445/41 |
| 6,936,854 B2 | 8/2005 | Iwasaki et al. | 257/81 |
| 7,411,209 B2 | 8/2008 | Endo et al. | 257/43 |
| 2003/0111663 A1 | 6/2003 | Yagi | 257/59 |
| 2005/0199880 A1 | 9/2005 | Hoffman et al. | 257/72 |
| 2006/0043410 A1 | 3/2006 | Iwasaki et al. | 257/103 |
| 2006/0113536 A1* | 6/2006 | Kumomi et al. | 257/57 |
| 2006/0244107 A1* | 11/2006 | Sugihara et al. | 257/646 |
| 2007/0194379 A1 | 8/2007 | Hosono et al. | 257/347 |
| 2007/0215945 A1* | 9/2007 | Tokunaga et al. | 257/347 |
| 2007/0278490 A1* | 12/2007 | Hirao et al. | 257/64 |
| 2008/0067508 A1* | 3/2008 | Endo et al. | 257/43 |

(Continued)

FOREIGN PATENT DOCUMENTS

JP 7-153971 A 6/1995

(Continued)

OTHER PUBLICATIONS

Myong et al. "Role of Intentionally Incorporated Hydrogen in Wide-Band-Gap ZnO Thin Film Prepared by Photo-MOCVD Technique" May 2005.*

(Continued)

*Primary Examiner* — Wael M Fahmy
*Assistant Examiner* — Sarah K Salerno
(74) *Attorney, Agent, or Firm* — Fitzpatrick, Cella, Harper & Scinto

(57) ABSTRACT

The present invention provides a field effect transistor including an oxide film as a semiconductor layer, wherein the oxide film includes one of a source part and a drain part to which one of hydrogen and deuterium is added.

10 Claims, 11 Drawing Sheets

U.S. PATENT DOCUMENTS

2008/0272370 A1    11/2008   Endo et al. .................. 257/43
2009/0189153 A1*   7/2009   Iwasaki et al. .............. 257/43

FOREIGN PATENT DOCUMENTS

| | | |
|---|---|---|
| JP | 2002-141359 A | 5/2002 |
| RU | 2 069 417 C1 | 11/1996 |
| WO | WO 2004/114391 A1 | 12/2004 |
| WO | WO 2005/088726 A1 | 9/2005 |
| WO | WO 2007/029844 A1 | 3/2007 |

OTHER PUBLICATIONS

K. Nomura et al., "Room-temperature fabrication of transparent flexible thin-film transistors using amorphous oxide semiconductors," Nature, vol. 432, No. 25, Nov. 25, 2004, pp. 488-492.

* cited by examiner

FIELD EFFECT TRANSISTOR USING OXIDE FILM FOR CHANNEL AND METHOD OF MANUFACTURING THE SAME

TECHNICAL FIELD

The present invention relates to a field effect transistor including an oxide film as a semiconductor layer, a method of manufacturing the same, and a display device. In particular, the present invention relates to a field effect transistor having transistor characteristics which can be applied to a display device or the like, a method of manufacturing the same, and a display device.

BACKGROUND ART

A field effect transistor (FET) is a three-terminal device having a gate electrode, a source electrode, and a drain electrode. Further, the field effect transistor is an electronic active device in which a current flowing through a channel layer (a current between a source electrode and a drain electrode) is controlled by voltage applied to a gate electrode. In particular, an FET which uses as a channel layer a thin film is called a thin film FET (thin film transistor, TFT). The device can be formed on an several substrates formed of ceramic, glass, plastic, or the like.

The above-mentioned TFT has an advantage of being easily formed on a substrate having a relatively large area because the TFT uses thin film technology, and is widely used as a driving device in a flat panel display device such as a liquid crystal display device. More specifically, in an active liquid crystal display (ALCD), TFTs formed on a glass substrate are used to turn on and off individual image pixels. Also, in a prospective high performance organic LED display (OLED), it is thought to be effective to current-drive the pixels by TFTs. Further, a higher performance liquid crystal display device is realized in which a TFT circuit having a function of driving and controlling the whole image is formed on a substrate in the vicinity of an image display region.

A TFT which is currently most widely used is a metal-insulator-semiconductor field effect transistor (MIS-FET) device using a polycrystalline silicon film or an amorphous silicon film as a channel layer material. An amorphous silicon TFT is practically used for pixel driving and a high-performance polycrystalline silicon TFT is practically used for drive control of the entire image.

However, it is difficult to form the amorphous silicon TFT and the polycrystalline silicon TFT on a substrate such as a plastic plate or a plastic film because a high-temperature process is essential for device formation.

In recent years, active development has been conducted for realizing a flexible display by using TFTs formed on a substrate such as a polymer plate or a polymer film for a driver circuit of an LCD or OLED. Attention is focused on an organic semiconductor film which is made of a material capable of being formed on a plastic film or the like, which can be formed at a low temperature.

For example, pentacene has been under research and development for the organic semiconductor film. The organic semiconductor has an aromatic ring. Large carrier mobility is obtained in the stack direction of the aromatic ring at the time of crystallization. For example, it is reported that, in the case where the pentacene is used for an active layer, the carrier mobility is approximately 0.5 cm$^2$ (Vs)$^{-1}$, which is equal to that of an amorphous Si-MOSFET.

However, the organic semiconductor such as the pentacene has low thermal stability (it is unstable when temperature exceeds 150° C.) and toxicity (carcinogenicity). Therefore, a practical device has not been realized.

Attention has been recently focused on an oxide material as a material which can be applied to the channel layer of a TFT.

For example, a TFT using, as the channel layer thereof, a transparent conductive oxide polycrystalline thin film containing ZnO as a main ingredient has been under active development. The thin film can be formed at a relatively low temperature, and therefore it is possible to form the film on a substrate such as a plastic plate or a plastic film. However, in the case of a compound containing ZnO as a main ingredient, a stable amorphous phase cannot be formed at a room temperature and a polycrystalline phase is formed. Therefore, it is difficult to increase an electron mobility thereof because of scattering of polycrystalline grain boundaries. In addition, it is difficult to achieve reproductivity in the characteristics of a TFT device because a polycrystalline grain shape and an interconnection thereof are significantly changed depending on film formation methods.

A thin film transistor using an amorphous In—Ga—Zn—O-based oxide has been reported by K. Nomura, et al., Nature, 432, 488 (2004). The thin film transistor can be formed on a plastic plate or a glass substrate at a room temperature. The device shows a normally-off characteristics with field effect mobility of approximately 6 to 9. There is also an advantage in that the thin film transistor is transparent to visible light.

The inventors of the present invention have studied a thin film transistor using an oxide including an amorphous In—Ga—Zn—O oxide. As a result, there is the case where a variation in transistor characteristic (Id-Vg characteristic) of a TFT occurs, although an extent of the variation is depended on the channel materials or the manufacturing conditions etc.

When the TFT is used for, for example, a pixel circuit of a display, the variation in characteristic causes a variation in operation of an organic LED or a liquid crystal element which is to be driven, thereby finally reducing the image quality of the display.

DISCLOSURE OF THE INVENTION

In view of the above, an object of the present invention is to reduce the above-mentioned variation in characteristic.

Examples of a factor of the variation include:

1) a parasitic resistance caused between each of source and drain electrodes and a channel; and 2) a variation in positional relationship among a gate, a source, and a drain.

Specifically, a first object of the present invention is to device a connection between the channel of a transistor and each of the source and drain electrodes thereof, thereby reducing the variation in characteristic.

A second object of the present invention is to provide a structure capable of forming the positional relationship among the gate, the source, and the drain with high precision and a manufacturing method thereof, thereby reducing the variation in characteristic.

The present invention provides a field effect transistor, including an oxide film as a semiconductor layer, wherein the oxide film includes one of a source part and a drain part which is added with one of hydrogen and deuterium.

The present invention also provides a field effect transistor, including an oxide film as a semiconductor layer, wherein the oxide film includes a channel part, a source part, and a drain part; and a concentration of one of hydrogen and deuterium in the source part and the drain part is larger than a concentration of one of hydrogen and deuterium in the channel part.

The field effect transistor according to the present invention is used for a display device according to the present invention.

Further, the present invention provides a method of manufacturing a field effect transistor including an oxide film as a semiconductor layer, including the steps of: forming the oxide film on a substrate; and adding one of hydrogen and deuterium to a portion of the oxide film to form a source part and a drain part.

Furthermore, the present invention provides a method of manufacturing a field effect transistor including an oxide film as a semiconductor layer, including the steps of: forming the oxide film on a substrate; forming a gate electrode on the oxide film thorough a gate insulating film; and adding one of hydrogen and deuterium to the oxide film using a pattern of the gate electrode as a mask to form a source part and a drain part in the oxide film in self-alignment with the pattern of the gate electrode.

BEST MODE FOR CARRYING OUT THE INVENTION

Figure 1A:
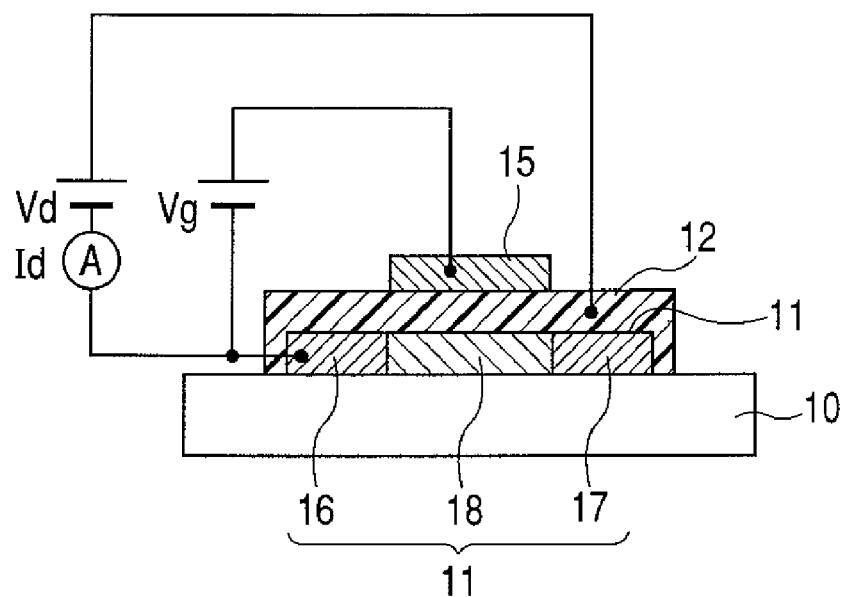
FIGS. 1A and 1B are cross sectional views illustrating structural examples of a field effect transistor according to the present invention.
Figure 1B:
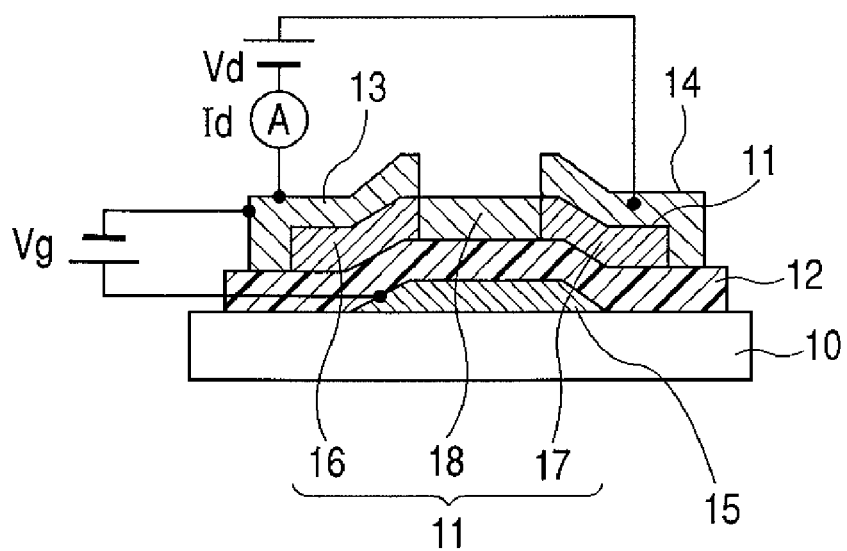

FIGS. 1A and 1B are cross sectional views illustrating structural examples of a field effect transistor according to an embodiment of the present invention. FIG. 1A illustrates an example of a top-gate structure and FIG. 1B illustrates an example of a bottom-gate structure.

In FIGS. 1A and 1B, provided are on a substrate 10, a channel layer (oxide thin film) 11, a gate insulating layer 12, a source electrode 13, a drain electrode 14, a gate electrode 15, a source part 16, a drain part 17, and a channel part 18. The channel layer 11 includes the source part 16, the drain part 17, and the channel part 18.

As illustrated in FIG. 1A, the gate insulating layer 12 and the gate electrode 15 are formed on the channel layer 11 in mentioned order, thereby obtaining the top-gate structure. As illustrated in FIG. 1B, the gate insulating layer 12 and the channel layer 11 are formed on the gate electrode 15 in mentioned order, thereby obtaining the bottom-gate structure. In FIG. 1A, the source part and the drain part also serve as the source electrode and the drain electrode, respectively. In FIG. 1B, the channel part of the transistor and the source electrode (drain electrode) are connected with each other through the source part (drain part).

As illustrated in each of FIGS. 1A and 1B, in the field effect transistor (FET) according to this embodiment, the oxide thin film which is the channel layer 11 includes the channel part 18, the source part 16, and the drain part 17. The source part 16 and the drain part 17 are added with hydrogen or deuterium to reduce a resistivity thereof. When the channel part 18 contains hydrogen or deuterium, the concentration of hydrogen or deuterium of each of the source part 16 and the drain part 17 is set to a value larger than the concentration of hydrogen or deuterium of the channel part 18. There are the case where hydrogen or deuterium is actively added to the channel part 18 and the case where hydrogen is contained therein without adding hydrogen actively. As described later, the electric conductivity of the source part (drain part) can be increased by the addition of hydrogen or deuterium thereto. In addition, when the concentration of hydrogen or deuterium of the source part (drain part) is increased to a value larger than the concentration of hydrogen or deuterium of the channel part 18, the electric conductivity of the source part (drain part) can be set to a value larger than the electric conductivity of the channel part. According to the structure, the channel part and the source (drain) electrode can be electrically connected with each other with high reliability, whereby a thin film transistor having small variation can be realized.

In particular, according to this embodiment, the source part and the drain part are formed in the oxide film. Therefore, stable electrical connection can be made in comparison with the case of a conventional structure in which the source electrode and the drain electrode are directly formed on the oxide film.

In this embodiment, a top-gate structure, a bottom-gate structure, a staggered structure, or a coplanar structure can be arbitrarily used as the structure of the field effect transistor. In view of the stable electrical connection, the coplanar structure illustrated in FIG. 1A may be used. When the coplanar structure is used, the source and drain electrodes are directly connected with an interface between the gate insulating layer and the channel layer, and high-reliability electrical connection can be attained.

The transistor according to this embodiment may have a structure in which the gate electrode and the source (drain) part are formed in self-alignment. That is, as described later, hydrogen is added to the oxide film by using a pattern of the gate electrode as a mask, whereby the source part and the drain part in self-alignment with respect to the pattern of the gate electrode are formed in the oxide film.

When the self-alignment method is used, a transistor can be realized in which the overlap between the source (drain) part and the gate electrode is small and uniform. As a result, a parasitic capacitance of the transistor which is caused in an overlap portion between the gate electrode and the drain part can be reduced and made uniform. Because of the small parasitic capacitance, high-speed operation can be realized. Because of the uniform parasitic capacitance, a transistor excellent in uniform characteristics is can be realized.
(Source and Drain Parts)

As described earlier, the source part 16 and the drain part 17 are added with hydrogen or deuterium to reduce resistivity thereof. The inventors of the present invention found that, when hydrogen (or deuterium) is added to an amorphous In—Ga—Zn—O thin film, the electric conductivity of the oxide thin film becomes larger. In the case that the channel part 18 contains hydrogen or deuterium, the concentration of hydrogen or deuterium of each of the source part and the drain part is increased to a value larger than the concentration of hydrogen or deuterium of the channel part, so electrical connecting can be improved.

Figure 2:
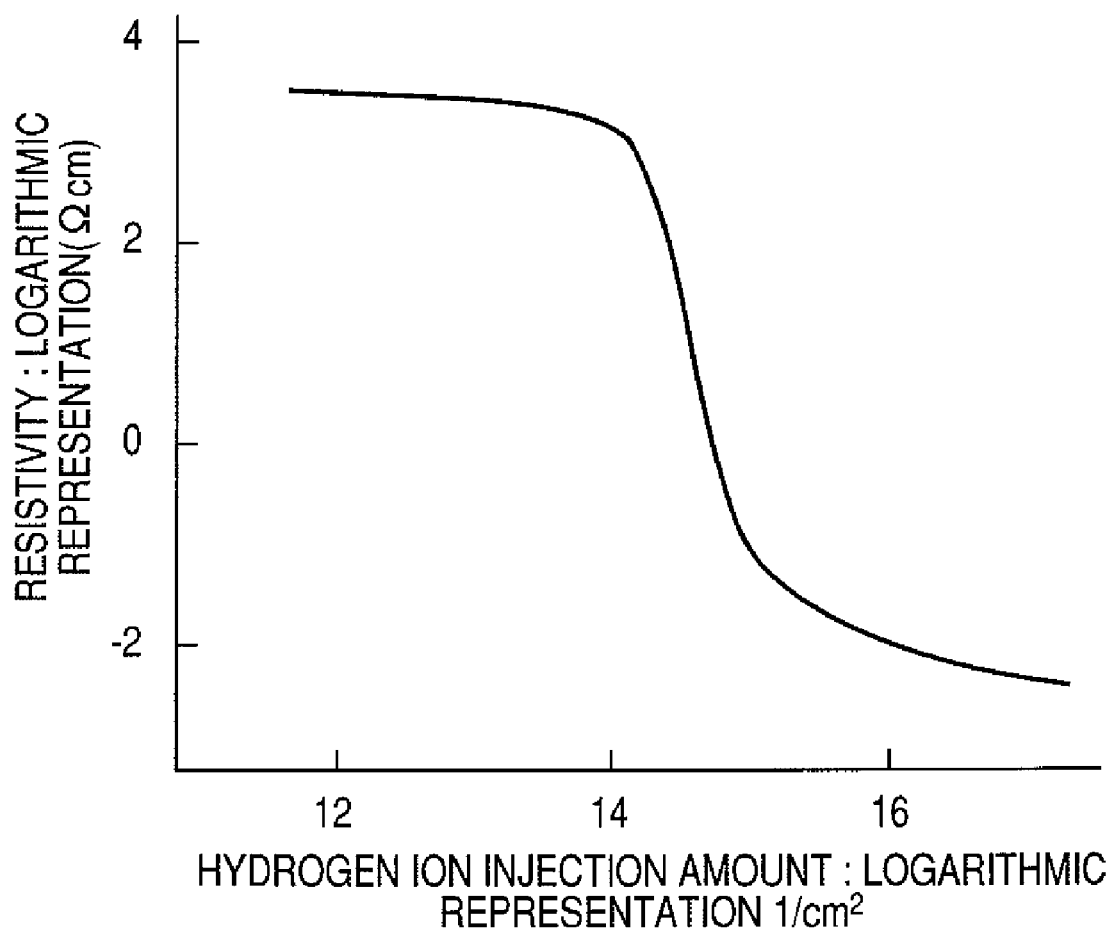
FIG. 2 is a diagram illustrating a change in resistivity of amorphous In—Ga—Zn—O oxide film in a case where hydrogen is added thereto.

FIG. 2 is a characteristic graph illustrating an example of a relationship between a hydrogen ion implantation amount and resistivity. FIG. 2 illustrates a change in electric conductivity to the hydrogen ion implantation amount in the case where ions are implanted into an InGaZnO$_4$ thin film having a film thickness of approximately 500 nm. The abscissa (x-axis) is a logarithmic representation of the hydrogen ion implantation amount per unit area and the ordinate (y-axis) is a logarithmic representation of the resistivity. Therefore, hydrogen can be added to the amorphous oxide film to control the electric conductivity.

When hydrogen or deuterium is added to the source part and the drain part, the electric conductivity thereof can be increased. When the channel part contains hydrogen or deuterium, the concentration of hydrogen of each of the source part and the drain part is increased to a value larger than the concentration of hydrogen of the channel part. Therefore, the electric conductivity of each of the source part and the drain part can be set to a value larger than the electric conductivity of the channel part. As described above, when each of the source part and the drain part is made of a material substantially identical (except for the hydrogen concentration) to that of the channel part, satisfactory electrical connection between the channel part and each of the source electrode and the drain electrode can be realized. That is, the source (drain) electrode is connected with the channel part through the source (drain) part, thereby realizing the satisfactory electrical connection.

In this embodiment, any resistivity that is smaller than the resistivity of the channel part can be used as the resistivity of each of the source part and the drain part. The resistivity of each of the source part and the drain part may be equal to or smaller than $1/10$ of the resistivity of the channel part. When the resistivity of each of the source part and the drain part becomes equal to or smaller than $1/1000$ of the resistivity of the channel part, the source (drain) part can be used as the source (drain) electrode.

The amount of change in resistivity to a change in hydrogen concentration depends on a composition of the oxide film, film quality thereof, or the like. For example, when hydrogen ions of approximately $10^{17}$ (1/cm$^3$) per volume are implanted into an In—Ga—Zn—O thin film having approximately 1000 Ωcm, the resistivity thereof can be reduced to approximately several 50 Ωcm. When hydrogen ions of approximately $10^{19}$ (1/cm$^3$) are implanted, the resistivity can be reduced to approximately 0.5 Ωcm. A concentration range of the hydrogen added to each of the source part and drain part depends on a structure of the oxide film, but a concentration may be equal to or larger than $10^{17}$/cm$^3$. In particular, when a concentration equal to or larger than approximately $10^{19}$/cm$^3$ is set, the electric conductivity of each of the source part and the drain part becomes larger, so the source part and the drain part can be used as the source electrode and the drain electrode.

As described above, depending on a film formation condition, the oxide film may contain hydrogen without active hydrogen addition in some cases. Therefore, there is the case where the channel part contains hydrogen without adding hydrogen actively. Even in such a case, in order to form the source part and the drain part, hydrogen is added in a post-process such that a hydrogen amount which exceeds the amount of hydrogen contained in the channel part is introduced into the source part and the drain part. Therefore, the structure and the effect as described above can be realized.

A method of locally reducing a hydrogen amount in a portion of the oxide film may also be employed, to use the portion as the channel part.

The concentration of hydrogen can be evaluated by the measurement using SIMS (secondary ion mass spectrometry). Depending on an evaluation apparatus, a detection limit is approximately $10^{17}$/cm$^3$. A value equal to or smaller than the detection limit can be indirectly calculated by an extrapolation based on a linear relationship between a hydrogen addition process parameter (oxygen partial pressure at the time of film formation or ion implantation amount as described later) and the amount of hydrogen contained in the thin film.

Figure 6:
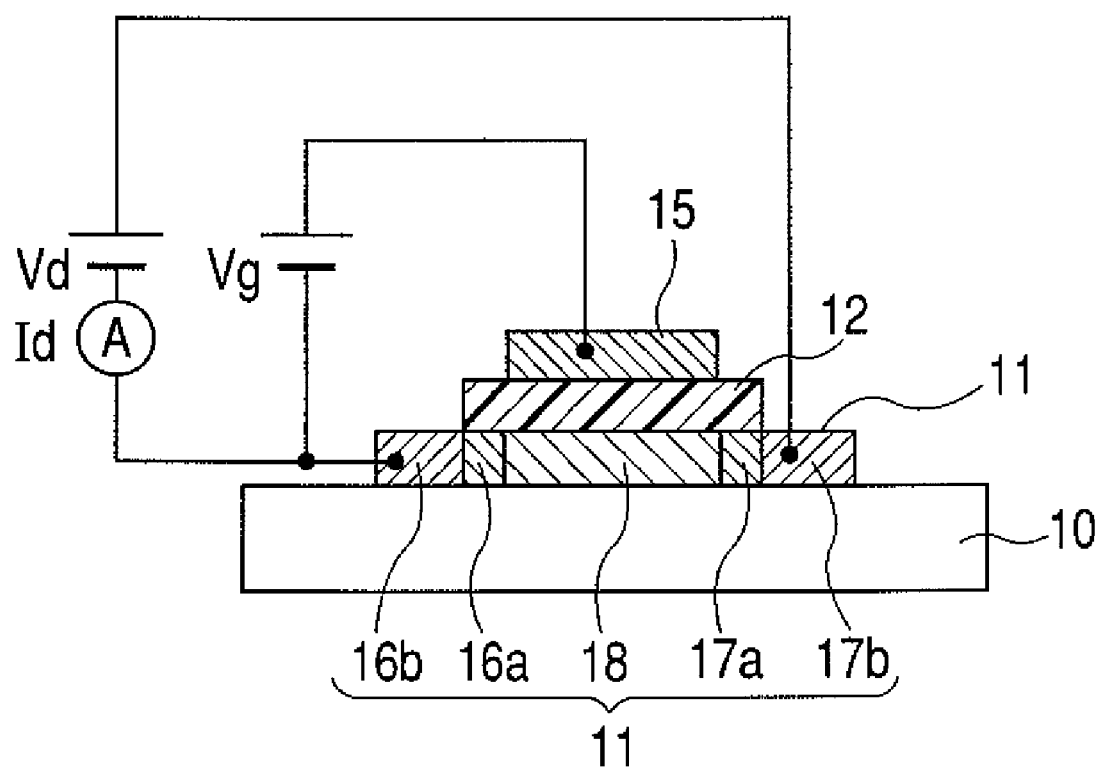
FIG. 6 is a cross sectional view illustrating a structural example of a field effect transistor according to the present invention.

In each of FIGS. 1A and 1B, the single source part and the single drain part are formed. As illustrated in FIG. 6, multiple source parts 16a and 16b and multiple drain parts 17a and 17b may be provided. The source parts 16a and 16b have different electric conductivities. The drain parts 17a and 17b have different electric conductivities. The electric conductivity may increase in order of the channel part 18, the source part 16a, and the source part 16b. Further, the electric conductivity may increase in order of the channel part 18, the drain part 17a, and the drain part 17b. To obtain such a structure, it is only necessary to increase the additional amount of hydrogen ion in order of the channel part 18, the source part 16a, and the source part 16b and to increase the additional amount of hydrogen in order of the channel part 18, the drain part 17a, and the drain part 17b.
(Channel Layer; Oxide Film)

Any material that is oxide can be used as the material of the channel layer (oxide film). Examples of the material include In oxide and Zn oxide from which a large mobility can be obtained. Further, the channel layer may be made of amorphous oxide. When the following amorphous oxide film is added with hydrogen, the electric conductivity can be effectively increased.

In particular, components of the channel layer made of amorphous oxide are represented by

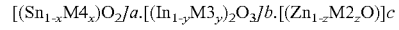

where $0 \leq x \leq 1$, $0 \leq y \leq 1$, $0 \leq z \leq 1$,
$0 \leq a \leq 1$, $0 \leq b \leq 1$, $0 \leq c \leq 1$, and $a+b+c=1$,
M4 is a group VI element (Si, Ge, or Zr) having an atomic number smaller than that of Sn,
M3 is Lu or a group III element (B, Al, Ga, or Y) having an atomic number smaller than that of In, and
M2 is a group II element (Mg or Ca) having an atomic number smaller than that of Zn.

In particular, $[(In_{1-y}Ga_y)_2O_3]b \cdot [(ZnO)]c$ (where $0 \leq y \leq 1$, $0 \leq b \leq 1$, and $0 \leq c \leq 1$) and $[SnO_2]a \cdot [(In_2O_3)]b \cdot [(ZnO)]c$ (where $0 \leq a \leq 1$, $0 \leq b \leq 1$, and $0 \leq c \leq 1$) are preferable.

For example, the amorphous oxide film can be realized based on a unary, binary, or ternary composition located in an inner region of a triangle in which $SnO_2$, $In_2O_3$, and ZnO are set in vertices. Depending on a composition ratio of the ternary composition, there is the case where crystallization is made in a composition ratio range. For example, with respect to the binary composition including two of three kinds of compounds as described above (composition located in a side of the triangle), an amorphous In—Zn—O film can be formed with a composition in which In is contained therein at equal to or more than approximately 80 atomic % or more and an amorphous Sn—In—O film can be formed with a composition in which In is contained therein at approximately 80 atomic %.

Further, an amorphous oxide may contain In, Ga, and Zn.

The inventors of the present invention studied a thin film transistor in which the amorphous oxide is applied to the channel layer. As a result of the study, it is found that a semi-insulating amorphous oxide film having an electric conductivity of 10 S/cm or more and 0.0001 S/cm or less may be applied to the channel, in order to obtain excellent TFT characteristics. Depending on a material composition of the channel, in order to obtain the electric conductivity, an amorphous oxide film may be formed which has an electron carrier concentration of approximately $10^{14}$ to $10^{18}/cm^3$.

When the electrical conductivity is 10 S/cm or more, a normally-off transistor can not be formed, and the on/off ratio can not be made large. In extreme cases, even if gate voltage is applied, the current between the source and drain electrodes is not switched on/off, and transistor operation is not observed.

On the other hand, in the case of an insulator, in other words, when the electrical conductivity is equal to or less than 0.0001 S/cm, the on-current can not be made large. In extreme cases, even if gate voltage is applied, the current between the source and drain electrodes is not switched on/off, and transistor operation is not observed.

Figure 9:
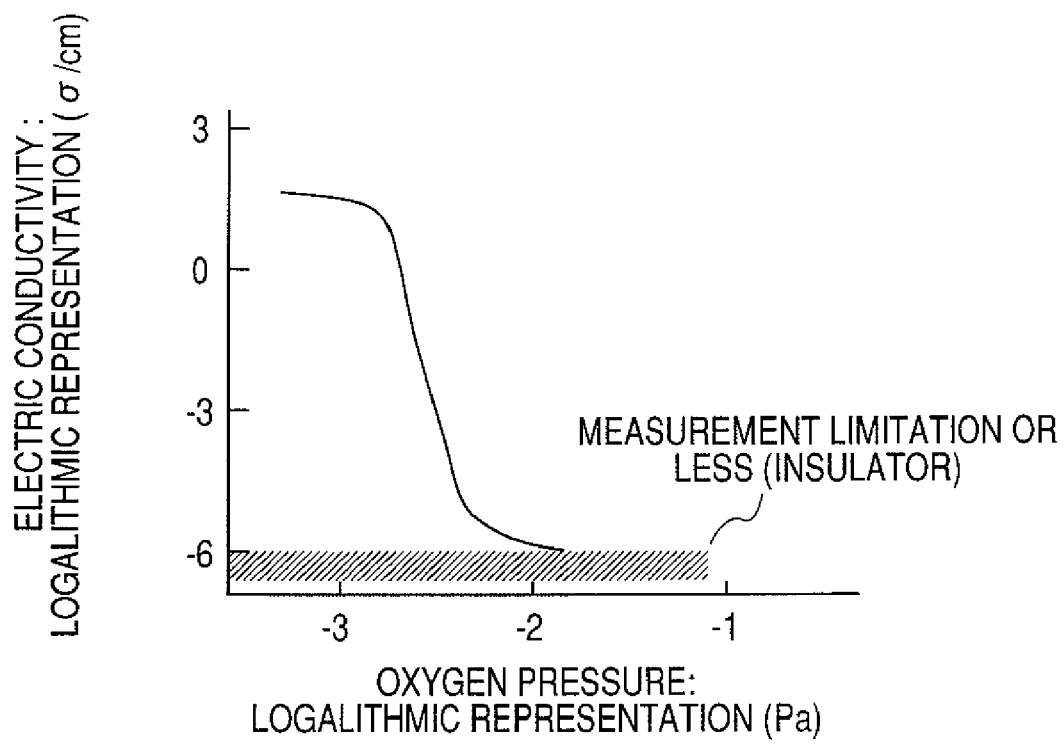
FIG. 9 is a graph illustrating a relationship between electric conductivity of an amorphous In—Ga—Zn—O oxide film and an oxygen partial pressure during film formation.

For example, the electrical conductivity of an oxide used for the channel layer can be controlled by controlling the oxygen partial pressure at the time of forming the film. More specifically, by controlling the oxygen partial pressure, the amount of oxygen vacancy in the thin film is mainly controlled, whereby the electron carrier concentration is controlled. FIG. 9 is a diagram illustrating exemplary dependence of the electrical conductivity on the oxygen partial pressure when an In—Ga—Zn—O oxide thin film is formed by sputtering. In reality, by highly controlling the oxygen partial pressure, a semi-insulating film which is an amorphous oxide film with a semi-insulating property having an electron carrier concentration of $10^{14}$ to $10^{18}/cm^3$ can be obtained. By using the thin film as described above for the channel layer, a satisfactory TFT can be formed. As illustrated in FIG. 9, by forming a film with an oxygen partial pressure of typically approximately 0.005 Pa, a semi-insulating thin film can be obtained. When the oxygen partial pressure is 0.001 Pa or less, the formed thin film is insulating, while, when the oxygen partial pressure is 0.01 Pa or more, the electrical conductivity is so high that the film is inappropriate for a channel layer of a transistor.

Several amorphous oxide films, formed in different oxygen partial pressures, were prepared and their transport properties were compared. in a film formation atmosphere is adjusted to evaluate an electron transport properties When the oxygen partial pressure increases, there is the tendency to increase both the carrier concentration and the electron mobility. Hall mobility measurement is employed for the evaluation.

In the case of a general semiconductor of Si, GaAs, ZnO etc., when the carrier concentration increases, the electron mobility reduces due to, for example, the interaction among carriers and dopant. On the other hand, in the case of the amorphous oxide film used in this embodiment, the electron mobility increases with an increase in electron carrier concentration. When a voltage is applied to the gate electrode, electrons can be implanted into the channel layer of the amorphous oxide. Therefore, a current flows between the source electrode and the drain electrode, an on-state is obtained between both the electrodes. In the case of the amorphous oxide film in this embodiment, when the electron carrier concentration increases, the electron mobility becomes larger, so a current flowing into the transistor which is in the on-state can be made larger. That is, a saturation current and an on/off ratio can be made larger.

(Gate Insulating Layer)

In the case of the field effect transistor according to this embodiment, any material that has a satisfactory insulating property can be used for the gate insulating layer 12. For example, $Al_2O_3$, $Y_2O_3$, $HfO_2$, or a mixed compound including at least two of those compounds can be used for the gate insulating layer 12. Therefore, each of a leak current flowing between the source electrode and the gate electrode and a leak current flowing between the drain electrode and the gate electrode can be reduced to approximately $10^{-7}$ amperes.

(Electrodes)

Any material that has satisfactory electric conductivity and can make electrical connection with the source part 16 and the drain part 17 can be used for each of the source electrode 13, the drain electrode 14. Any material can be also used for the gate electrode 15. For example, a transparent conductive film composed of $In_2O_3$:Sn, ZnO, or the like or a metal film composed of Au, Pt, Al, Ni, or the like may be used.

When each of the gate part and the drain part has sufficient electric conductivity, the electrodes can be omitted as illustrated in FIG. 1A.

Figure 5A:
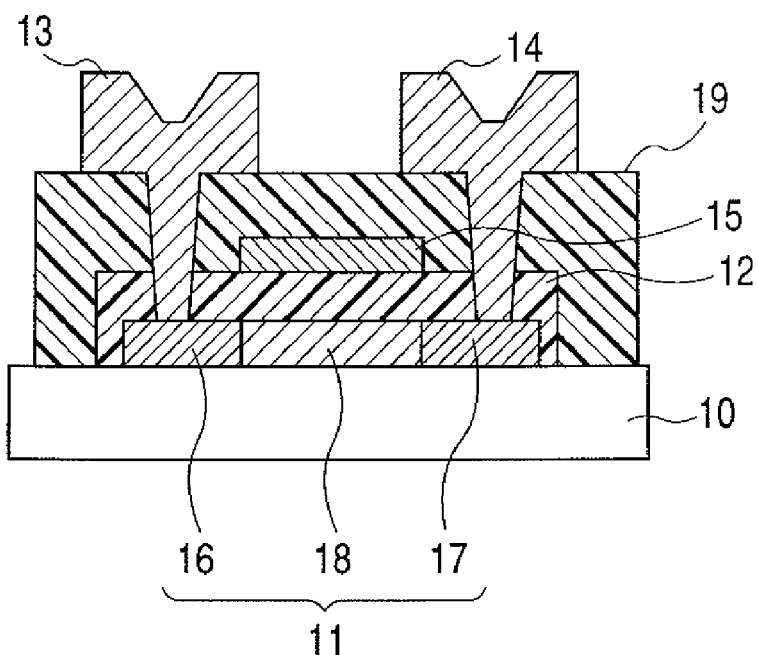
FIGS. 5A and 5B are cross sectional views illustrating structural examples of a field effect transistor according to the present invention.
Figure 5B:
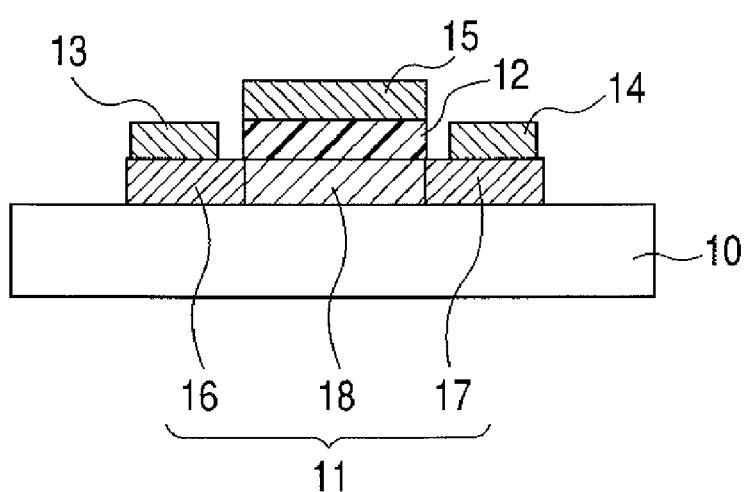

FIGS. 1B, 5A, and 5B each illustrate a structural example in which the source electrode 13 and the drain electrode 14 are provided. In FIG. 5A, an insulating layer 19 is provided on the structure illustrated in FIG. 1A and the source electrode and the drain electrode are connected with the source part and the drain part through vias.

(Substrate)

A glass substrate, a plastic substrate, a plastic film, or the like can be used as the substrate 10.

The channel layer and the gate insulating layer as described above are transparent to visible light. Therefore, when a transparent material are used for the electrodes and the substrate, a transparent thin film transistor can be produced.

(TFT Characteristics)

The field effect transistor has a three-terminal device including the gate electrode 15, the source electrode 13, and the drain electrode 14. The field effect transistor is an electronic active device having a function for controlling a current Id flowing into the channel based on a voltage Vg applied to the gate electrode. This enables to control the current Id flowing between the source electrode and the drain electrode.

Figure 7A:
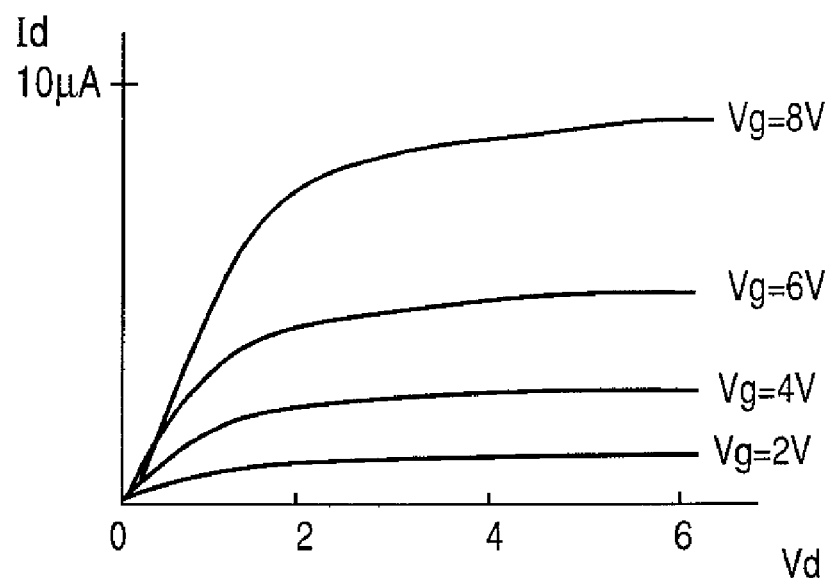
FIGS. 7A and 7B are graphs illustrating TFT characteristics of a field effect transistor according to the present invention.
Figure 7B:
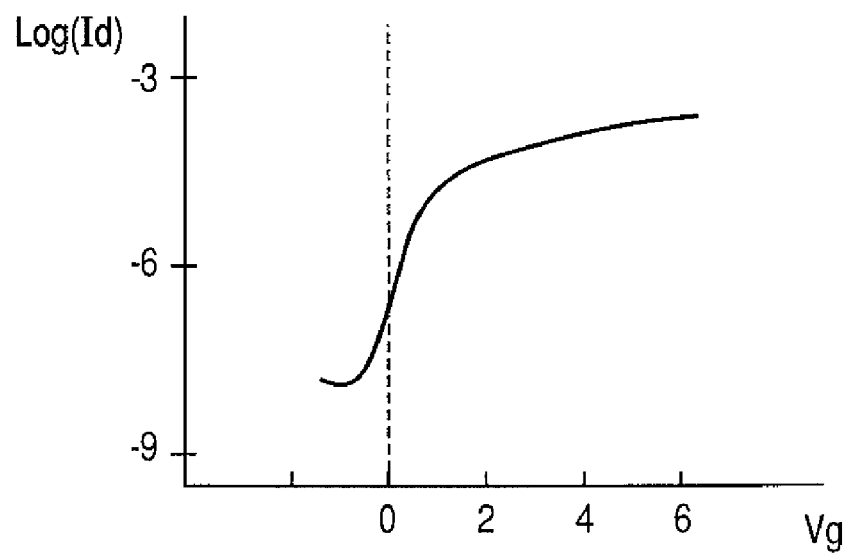

FIGS. 7A and 7B illustrate typical characteristics of the field effect transistor according to this embodiment. While a voltage Vd of approximately 5 V is applied between the source electrode and the drain electrode, the gate voltage Vg to be applied is switched between 0 V and 5 V, the current Id (unit: μA) flowing between the source electrode and the drain electrode can be controlled (switched on/off). FIG. 7A illustrates an example of an Id-Vd characteristic at each Vg and FIG. 7B illustrates an example of Id-Vg characteristic (transfer characteristic) at Vd of 6 V.

(Hysteresis)

Figure 8A:
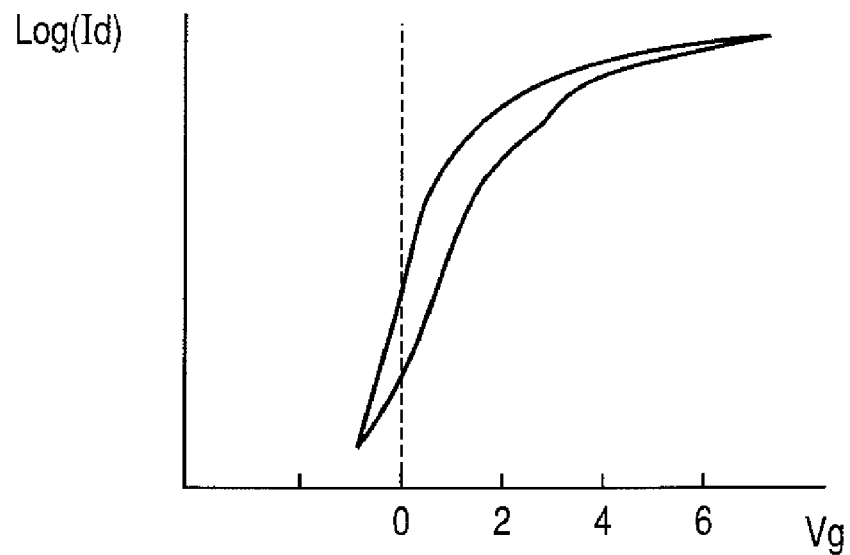
FIGS. 8A and 8B are graphs illustrating a hysteresis characteristic of the field effect transistor according to the present invention.
Figure 8B:
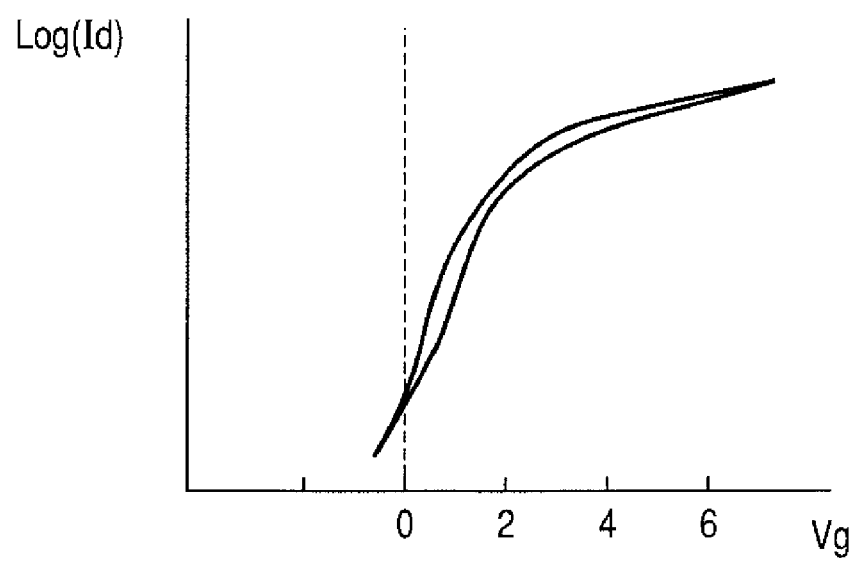

Reduction in hysteresis which is one of effects in this embodiment will be described with reference to FIGS. 8A and 8B. The hysteresis means that, as illustrated in FIGS. 8A and 8B, in the case where a TFT transfer characteristic is evaluated, when Vg is swept (risen and fallen) while Vd is held, a change in value of Id during the rise of the voltage is different from that during the fall of the voltage. When the hysteresis is large, the value of Id obtained at set Vg varies. Therefore, a device having small hysteresis may be used.

FIGS. 8A and 8B illustrate examples of the TFT transfer characteristic in the case of a conventional structure in which the source electrode and the drain electrode are directly formed on the oxide film and the TFT transfer characteristic in the case of the structure in this embodiment in which the source part and the drain part, each of which has a high hydrogen concentration, are provided. The conventional structure exhibits the hysteresis characteristic as illustrated in FIG. 8A. In contrast to this, when the source part and the drain part, each of which is added with hydrogen, are further provided as in this embodiment, the device having small hysteresis as illustrated in FIG. 8B can be obtained.

When the channel is connected with the source (drain) electrode through the source (drain) part added with hydrogen, the amount of charges trapped in a connection portion may be lowered to reduce the hysteresis.

(Manufacturing Method)

The field effect transistor described above can be manufactured by the following manufacturing method.

That is, the manufacturing method includes a step of forming the oxide film which is the channel layer and a step of adding hydrogen to portions of the oxide film to form the source part and the drain part.

A method of forming in advance an oxide film having a resistance value suitable to provide the channel part and then adding hydrogen to portions of the oxide film to form the source part and the drain part may be used.

Alternatively, a method may be used in which an oxide film having a resistance value slightly smaller than the resistance value suitable to provide the channel part is formed in advance and then a hydrogen concentration of a portion of the oxide film is reduced to form the channel part. The former method is suitable because it is easy to control the hydrogen concentration.

Several deposition methods such as a sputtering method (SP method), a pulse laser deposition method (PLD method), or an electron beam deposition method may be used as a method of forming the oxide film. The SP method is suitable in view of mass productivity. However, the film formation method is not limited to those methods. A temperature of a substrate during film formation can be held to substantially a room temperature without intentional heating.

A method such as hydrogen ion implantation, hydrogen plasma processing, hydrogen atmosphere processing, or diffusion from an adjacent hydrogen-containing film can be used as the method of adding hydrogen to the oxide film. Of the methods, the ion implantation method is suitable in view of the control of a hydrogen content. An $H^+$ ion, an $H^-$ ion, a $D^+$ ion (deuterium ion), an $H^{2+}$ ion (hydrogen molecular ion), or the like can be used as an ion species for the ion implantation method. In contrast to this, the hydrogen plasma processing is suitable in view of throughput.

For example, the hydrogen plasma processing can be performed using a parallel-plate type plasma CVD apparatus or an RIE type plasma etching apparatus.

Next, a self-alignment process in this embodiment will be described.

In this method, in order to form the source part and the drain part, hydrogen is added to the oxide film using the pattern of the gate electrode located above the channel layer as a mask. According to the method, the source part and the drain part can be formed in self-alignment with the gate electrode.

The self-alignment process in this embodiment with respect to an example of the top-gate thin film transistor illustrated in FIG. 1A will be described with reference to FIGS. 3A and 3B.

First, the oxide film which is the channel layer 11 is formed on the substrate 10 by patterning. Next, the gate insulating layer 12 is deposited. Then, the gate electrode 15 is formed by patterning. In a hydrogen addition step, hydrogen is added into the oxide film by a method such as hydrogen ion implantation or hydrogen plasma processing, using the gate electrode as the mask (FIG. 3A), thereby forming the source part 16 and the drain part 17 (FIG. 3B). After that, annealing may be performed to uniform the hydrogen amount.

Therefore, the coplanar transistor can be easily produced by the self-alignment method of adding hydrogen to the channel layer 11 using the gate electrode 15 as the mask.

When such a method is used, the overlap between the gate electrode and each of the source and drain parts can be reduced. The overlap inhibits the high-speed operation of the transistor because the overlap acts as a capacitor (parasitic capacitor). A variation in overlap causes a variation in transistor characteristic. When the self-alignment process is used, a parasitic capacitance of the transistor which is caused in an overlap portion between the gate electrode and each of the source and drain parts can be reduced and made uniform. As a result, it is possible to produce a transistor having high drive capability and excellent uniformity.

When the method is used, the positional relationship among the gate, the source, and the drain can be automatically determined without mask alignment which is likely to cause an error. Because the self-alignment method is used, high-precision mask alignment is unnecessary. A mask alignment margin for allowing an error caused in the mask alignment is also unnecessary, so a size of the device can be reduced.

The method can be performed at a low-temperature process, so the thin film transistor can be formed on the substrate such as the plastic plate or the plastic film.

According to this embodiment, the number of etching processes and the number of lift-off processes can be reduced to form the source and the drain. Therefore, electrode-semiconductor connection can be realized in a low-cost process with excellent stability.

A display device can be produced in which the drain corresponding to an output terminal of the field effect transistor is connected with an electrode of a display element such as an organic or inorganic electroluminescent (EL) element or a liquid crystal element. A structural example of a specific display device will be described below with reference to a display device cross sectional view.

Figure 11:
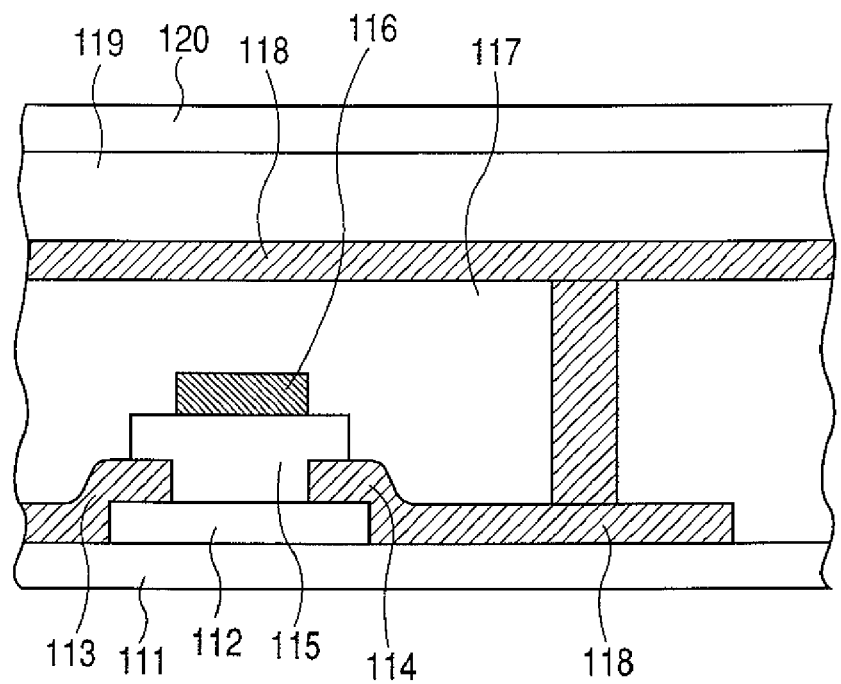
FIG. 11 is a cross sectional view illustrating an example of a display device according to the present invention.

For example, as illustrated in FIG. 11, a field effect transistor including an oxide film (channel layer) 112, a source electrode 113, a drain electrode 114, a gate insulating film 115, and a gate electrode 116 is formed on a base 111. The drain electrode 114 is connected with an electrode 118 through an interlayer insulating film 117. The electrode 118 is in contact with a light-emitting layer 119. The light-emitting layer 119 is in contact with an electrode 120. According to such a structure, a current injected into the light-emitting layer 119 can be controlled based on a current value flowing between the source electrode 113 and the drain electrode 114 through the channel formed in the oxide film 112. Therefore, the current injected into the light-emitting layer 119 can be controlled based on a voltage applied to the gate electrode 116 of the field effect transistor. The electrode 118, the light-emitting layer 119, and the electrode 120 compose an inorganic or organic electroluminescent element.

Figure 12:
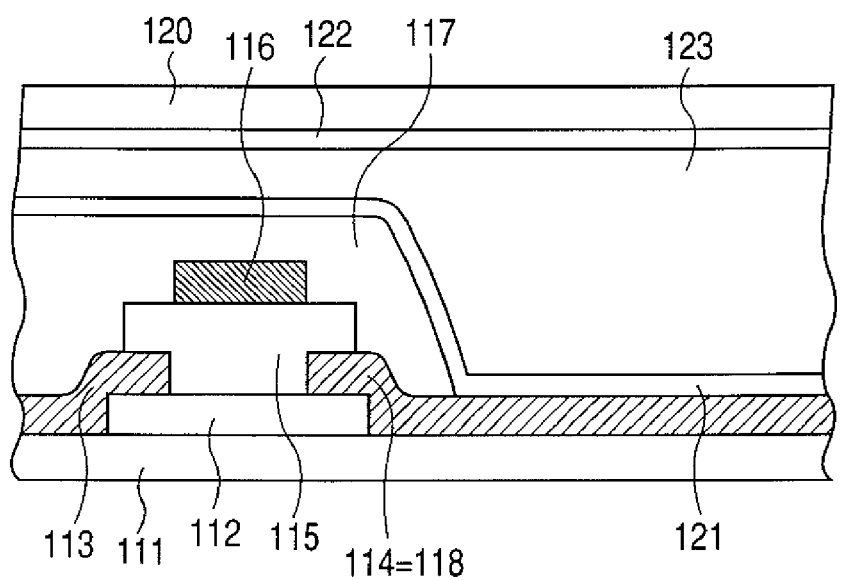
FIG. 12 is a cross sectional view illustrating another example of a display device according to the present invention.

Alternatively, as illustrated in FIG. 12, the drain electrode 114 is extended to also serve as the electrode 118, so a structure can be provided in which the drain electrode 114 is used as the electrode 118 for applying a voltage to a liquid crystal cell or electrophoresis particle cell 123 sandwiched between high-resistance films 121 and 122. The liquid crystal cell or electrophoresis particle cell 123, the high-resistance films 121 and 122, the electrode 118, and the electrode 120 compose a display element. A voltage applied to the display element can be controlled based on a voltagevalue of the drain electrode 114 Therefore, the voltage applied to the display element can be controlled based on a voltage applied to the gate electrode 116 of the TFT. When a display medium of the display element is a capsule in which a fluid and particles are sealed in an insulating coating, the high-resistance films 121 and 122 are unnecessary.

In the above-mentioned two examples of the field effect transistor, the top-gate coplanar structure is typically shown. However, this embodiment is not necessarily limited to this structure. For example, the connection between the drain electrode which is the output terminal of the field effect transistor and the display element is topologically the same, another structure such as the staggered structure can be employed.

In the two examples, the example in which the pair of electrodes for driving the display element are provided in parallel with the base is shown. However, this embodiment is not necessarily limited to such a structure. For example, the connection between the drain electrode which is the output terminal of the field effect transistor and the display element is topologically the same, any one of the electrodes or both the electrodes may be provided perpendicular to the base.

In the two examples, only one field effect transistor connected with the display element is shown. However, this embodiment is not necessarily limited to such a structure. For example, the field effect transistor shown in the drawing may be connected with another field effect transistor according to this embodiment. It is only necessary that the field effect transistor illustrated in the drawing be provided at a final stage of a circuit including field effect transistors.

In the case where the pair of the electrodes for driving the display element are provided in parallel with the base, when the display element is an EL element or a reflection display element such as a reflection liquid crystal element, it is necessary that any one of the electrodes be transparent to the wavelength of emitted light or the wavelength of reflected light. Alternatively, in the case of a display device such as a transmission-type liquid crystal element, it is necessary that each of the electrodes be transparent to transmitted light.

All members composing the field effect transistor according to this embodiment can be also made transparent, with the result that a transparent display element can be produced. Such a display element can be provided on a low-heat-resistant base such as a resin plastic substrate which is light weight, flexible, and transparent.

Next, a display device in which pixels, each of which includes an EL element (organic EL element in this case) and field effect transistors, are two-dimensionally arranged will be described with reference to FIG. 13.

Figure 13:
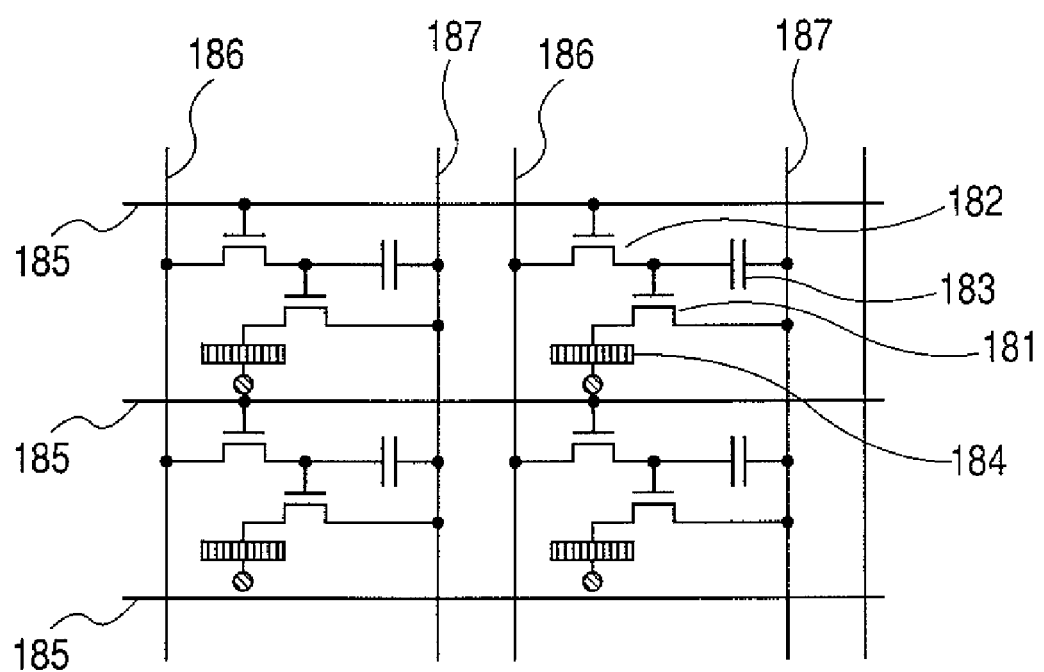
FIG. 13 is a diagram illustrating a structure of a display device in which pixels each including an organic EL device and a thin film transistor are two-dimensionally arranged.

In FIG. 13, a transistor 181 drives an organic EL layer 184 and a transistor 182 selects a pixel. A capacitor 183 which is used to maintain a selected state and located between a common electrode line 187 and the source portion of the transistor 182 stores charges to hold a signal applied to the gate of the transistor 181. The pixel selection is determined by a scanning electrode line 185 and a signal electrode line 186.

To be more specific, an image signal is applied as a pulse signal from a driver circuit (not shown) to a gate electrode through the scanning electrode line 185. At the same time, a pulse signal is applied from another driver circuit (not shown) to the transistor 182 through the signal electrode line 186, thereby selecting a pixel. At this time, the transistor 182 is turned ON to store charges in the capacitor 183 located between the signal electrode line 186 and the source of the transistor 182. Therefore, a gate voltage of the transistor 181 is held to a desirable voltage, so the transistor is turned ON. Such a state is held until a next signal is received. During a state in which the transistor 181 is being turned ON, a voltage and a current are being supplied to the organic EL layer 184 to maintain light emission.

In the structural example illustrated in FIG. 13, each pixel includes two transistors and a capacitor. In order to improve the performance, a larger number of transistors and the like may be incorporated. It is essential that an In—Ga—Zn—O field effect transistor which is the transparent field effect transistor according to this embodiment which can be formed at a low temperature be used for a transistor portion. Therefore, an effective EL element is obtained.

Next, examples of the present invention will be described with reference to the attached drawings.

Example 1

In this example, the top-gate TFT device having the coplanar structure as illustrated in FIG. 1A was manufactured.

Figure 3A:
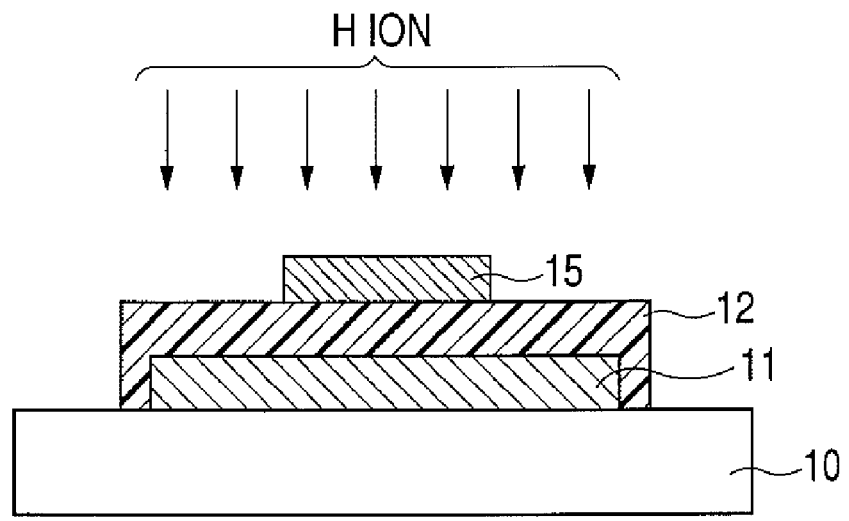
FIGS. 3A and 3B are cross sectional views illustrating a method of manufacturing a field effect transistor according to the present invention with using a self-alignment method.
Figure 3B:
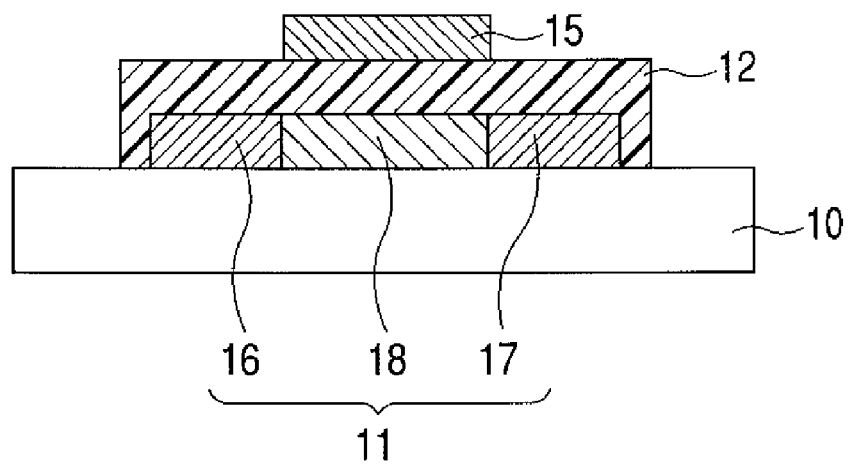

With respect to a manufacturing method, the self-alignment method illustrated in FIGS. 3A and 3B was applied to this example.

An amorphous In—Ga—Zn—O oxide was used for the channel layer 11. A hydrogen ion implantation method was used to form the source part and the drain part.

First, the amorphous oxide film as the channel layer 11 was formed on the glass substrate 10 (manufactured by Corning Incorporated, 1737). In this example, the amorphous In—Zn—Ga—O oxide film was formed by radio frequency sputtering under a mixed atmosphere of argon gas and oxygen gas.

Figure 10:
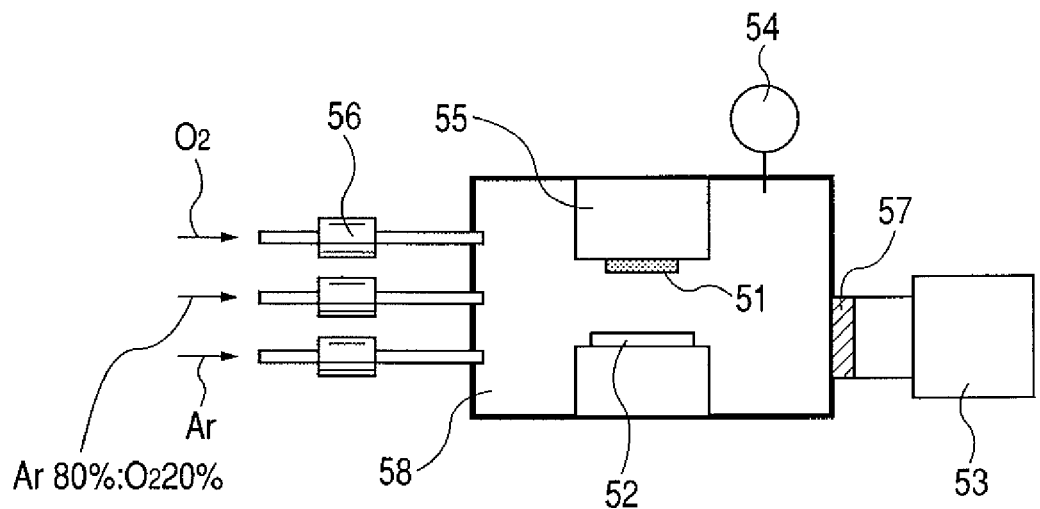
FIG. 10 is a cross sectional view illustrating an apparatus for forming the amorphous oxide film.

A sputtering apparatus for film formation as illustrated in FIG. 10 including a sample 51, a target 52, a vacuum pump 53, a vacuum gauge 54, a substrate holding means 55, gas flow rate control means 56 provided for the respective gas introduction systems, a pressure control means 57, and a film formation chamber 58, was used.

That is, the sputtering apparatus for film formation was used which includes the film formation chamber 58, the vacuum pump 53 for evacuating the film formation chamber, the substrate holding means 55 for holding the substrate on which the oxide film is formed in the film formation chamber, and the solid material source (target) 52 opposed to the substrate holding means, and further including an energy source (radio frequency power source which is not shown) for evaporating a material from the solid material source, and a means for supplying an oxygen gas into the film formation chamber.

There were provided three gas introduction systems for argon, oxygen, and mixed gas of argon and oxygen (Ar:$O_2$=80:20). With the gas flow rate control means 56 capable of independently controlling the flow rates of the respective gases and the pressure control means 57 for controlling the exhaust speed, a predetermined gas atmosphere was able to be obtained in the film forming chamber.

In this example, a polycrystalline sintered material having a composition of $InGaO_3$ (ZnO) having a size of two inches was used as the target (material source), and the applied RF power was 100 W. The total pressure of the atmosphere when the film was formed was 0.5 Pa, where the gas flow ratio was $Ar:O_2=100:1$. The film formation rate was 13 nm/min, and the temperature of the substrate was 25° C.

With regard to the obtained film, when glance angle X-ray diffraction (thin film method, incident angle was 0.5 degrees) was carried out approximately on the surface of the film, no clear diffraction peak was detected, which shows that the manufactured In—Zn—Ga—O film was an amorphous film.

Further, as a result of pattern analysis using spectroscopic ellipsometry, it was found that the root-mean-square roughness (Rrms) of the thin film was approximately 0.5 nm and the film thickness thereof was approximately 60 nm. As a result of X-ray fluorescence (XRF) spectroscopy, the compositional ratio of metals in the thin film was In:Ga:Zn=38:37:25.

The electrical conductivity was approximately $10^{-2}$ S/cm, the electron carrier concentration was $4\times10^{16}/cm^3$, and the estimated electron mobility was approximately 2 $cm^2/V$ sec.

From light absorption spectrum analysis, forbidden band energy width of the manufactured amorphous oxide film was approximately 3 eV.

Next, the gate insulating layer 12 was formed by patterning using a photolithography method and a lift-off method. The gate insulating layer was obtained by forming a $Y_2O_3$ film at a thickness of 150 nm using an electron beam deposition method. A relative dielectric constant of the $Y_2O_3$ film was approximately 15.

Further, the gate electrode 15 was formed using a photolithography method and a lift-off method. The channel length thereof was 40 μm while the channel width thereof was 200 μm. The electrode was made of Au and had a thickness of 30 nm.

Next, hydrogen (or deuterium) ion was implanted to the amorphous oxide thin film (FIG. 3A) to form the source part and the drain part in the channel layer (FIG. 3B). During the ion implantation, as illustrated in FIG. 3A, hydrogen ions were implanted into the channel layer through the gate insulating layer.

According to such a manner, the gate electrode was used as a mask and the source part and the drain part were arranged in self-alignment corresponding to the pattern of the gate electrode.

In the ion implantation, $H^+$ (proton) was used as an ion species and an accelerating voltage was 20 kV. An ion irradiation amount per area was able to be set to approximately $1\times10^{13}$ ($1/cm^2$) to $1\times10^{17}$ ($1/cm^2$). A specimen to which deuterium ions $D^+$ are implanted was separately prepared as in the above-mentioned case.

Composition analysis was performed using a SIMS to evaluate a hydrogen content. A hydrogen concentration of a thin film of a specimen irradiated with ions at $1\times10^{15}$ ($1/cm^2$) was approximately $2\times10^{19}$ ($1/cm^3$). Therefore, for example, in the case of a specimen in which an ion irradiation amount was $1\times10^{13}$ ($1/cm^2$), a hydrogen concentration was not able to be measured because it was equal to or smaller than the detection limit. However, it was able to be evaluated that the hydrogen concentration was approximately $2\times10^{17}$ ($1/cm^3$).

The hydrogen ion irradiation amount of each of the source part and the drain part in the thin film transistor according to this example was set to $1\times10^{16}$ ($1/cm^2$). The hydrogen concentration was evaluated to be approximately $2\times10^{20}$ ($1/cm^3$). Electric conductivity of a specimen separately prepared was evaluated. The electric conductivity was approximately 80 S/cm. In this example, each of the source part and the drain part had sufficient high electric conductivity, so that the structure illustrated in FIG. 1A with omitting a source electrode and a drain electrode was employed.

Comparative Example 1

In a comparative example, a device having a structure in which a source electrode and a drain electrode were directly formed on an oxide film was produced. An amorphous oxide layer was formed on a substrate. After that, the source electrode, the drain electrode, a gate insulating layer, and a gate electrode were formed by patterning. The self-alignment method was not used. The formation of each layer was performed based on Example 1. An Au electrode having a thickness of 30 nm was used as each of the source electrode and the drain electrode. Evaluation of Characteristics of TFT Device FIGS. 7A and 7B illustrate exemplary current-voltage characteristics of the TFT device measured at a room temperature. FIG. 7A illustrates the Id-Vd characteristics, while FIG. 7B illustrates the Id-Vg characteristics. As illustrated in FIG. 7A, when predetermined gate voltage Vg was applied and the dependence of the source-drain current Id on the drain voltage Vd along with variation of Vd was measured, behavior of a typical semiconductor transistor, i.e., saturation (pinch off) at a time when Vd was approximately 6V, was exhibited. With regard to the gain characteristics, when Vd of 4 V was applied, the threshold value of the gate voltage $V_G$ was approximately −0.5 V. When Vg was 10 V, the current Id of approximately $1.0\times10^{-5}$ A flew.

The on/off ratio of the transistor was 10 or more. Further, when the field effect mobility was calculated from the output characteristics, the field effect mobility of approximately 8 $cm^2(Vs)^{-1}$ was obtained in a saturation region. The manufactured device was irradiated with visible light and the same measurement was made. No change in the transistor characteristics was observed.

A variation in characteristics of a plurality of the devices produced on the same substrate was evaluated. The variation in this example was smaller than that in the comparative example. For example, a variation in on-currents was evaluated. The variation was approximately ±15% in the comparative example. In contrast to this, the variation was approximately ±10% in this example.

In the field effect transistor according to this example, the channel layer (oxide thin film) included the channel part, and the source part and the drain part, each of which had a hydrogen concentration larger than that of the channel part. Therefore, it is expected that stable electrical connection was able to be made between the channel part and each of the source electrode and the drain electrode, thereby improving the uniformity and reliability of the device.

The TFT according to this example had hysteresis smaller than that of the TFT of the comparative example. FIGS. 8A and 8B illustrate the Id-Vg characteristics in this example and the comparative example for comparison therebetween. FIG. 8A illustrates the comparative example and FIG. 8B illustrates the example of the TFT characteristics in this example. As shown in the drawings, when hydrogen was added to the channel layer, the hysteresis of the TFT was able to be reduced.

That is, according to this example, the satisfactory electrical connection which was resistant to trap charges was able to be realized between each of the source and drain electrode and the channel, so the thin film transistor having small hysteresis was able to be realized.

Next, the dynamic characteristic of the top-gate thin film transistor was evaluated. A voltage of 5 V was applied between the source and the drain. Voltages of +5 V and −5 V which were applied to the gate electrode, each of which had a pulse width of 30 μsec. and a period of 30 msec., were alternately switched to measure a response of a drain current. In this example, current rising was excellent and a variation in rising times between devices was small.

That is, according this example, the positional relationship among the gate, the source, and the drain was able to be realized with high precision by the self-alignment method. Therefore, high-speed operation was possible and the device having high uniformity was able to be realized.

A large characteristic difference was not observed between the case of the hydrogen ion implantation and the case of the deuterium ion implantation.

It can be expected that the field effect transistor having a relatively large field effect mobility according to this example be used for, for example, a circuit for operating an organic light emitting diode.

Example 2

In this example, a structure and a manufacturing method were based on Example 1. However, a hydrogen implantation amount was controlled such that the hydrogen concentration of each of the source part and the drain part became approximately $1 \times 10^{18}$ (1/cm$^3$).

In this example, the electric conductivity of each of the source part and the drain part was insufficient, and therefore the on-current was slightly smaller than that in Example 1. Electric conductivity of a specimen separately prepared at the above-mentioned hydrogen concentration was evaluated to obtain an electric conductivity of approximately 0.01 S/cm.

When the relatively low hydrogen concentration was applied to the source part and the drain part, the insulating layer 19, the source electrode, and the drain electrode were further provided as illustrated in FIG. 5A, so that the satisfactory transistor characteristics was able to be realized as in the case of Example 1. The hysteresis characteristic, the uniformity, and the high-speed operation performance were also preferable.

Example 3

This example is an example in which the bottom-gate TFT device having the coplanar structure as illustrated in FIG. 1B was manufactured.

In this example, the device was produced using the manufacturing method illustrated in FIGS. 4A to 4D. The self-alignment method was not used.

A channel layer made of amorphous In—Ga—Zn—O oxide was formed using a PLD method. The source part and the drain part were formed using hydrogen plasma processing.

First, the gate electrode 15 was patterned using a photolithography method and a lift-off method on a glass substrate 10 (manufactured by Corning Incorporated, 1737). The electrode was made of Ta and had a thickness of 50 nm.

Next, the gate insulating layer 12 was formed by patterning using a photolithography method and a lift-off method. The gate insulating layer was obtained by forming an HfO$_2$ film in a thickness of 150 nm using a laser deposition method.

Further, an amorphous In—Zn—Ga—O oxide film which is the channel layer was formed by patterning using a photolithography method and a lift-off method.

An amorphous In—Zn—Ga—O oxide film was deposited by a PLD method using a KrF excimer laser.

The amorphous In—Zn—Ga—O oxide film was deposited with using a polycrystalline sintered material having a composition of InGaO$_3$(ZnO)$_4$ as the target. The oxygen partial pressure when the film was formed was 7 Pa. It should be noted that the power of the KrF excimer laser was $1.5 \times 10^{-3}$ mJ/cm$^2$/pulse, the pulse width was 20 nsec, and the repetition frequency was 10 Hz. Further, the temperature of the substrate was 25° C.

As a result of X-ray fluorescence (XRF) spectroscopy, the compositional ratio of metals in the thin film was In:Ga:Zn=0.97:1.01:4. Further, as a result of pattern analysis using spectroscopic ellipsometry, it was found that the root-mean-square roughness (Rrms) of the thin film was approximately 0.6 nm and the film thickness thereof was approximately 100 nm. With regard to the obtained film, when glance angle X-ray diffraction (thin film method, incident angle=0.5 degrees) was carried out approximately on the surface of the film, no clear diffraction peak was detected, which shows that the manufactured In—Zn—Ga—O film was an amorphous film.

Figure 4A:
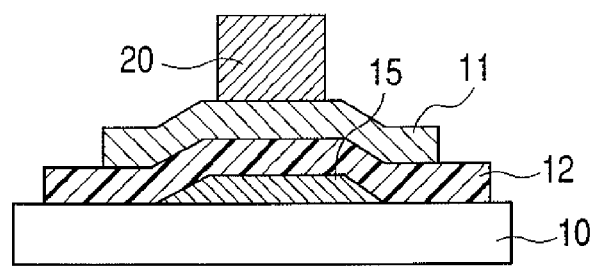
FIGS. 4A, 4B, 4C and 4D are cross sectional views illustrating a method of manufacturing a field effect transistor according to the present invention.

Next, a resist mask 20 having the same pattern as that of the gate electrode was formed by patterning (FIG. 4A).

Figure 4B:
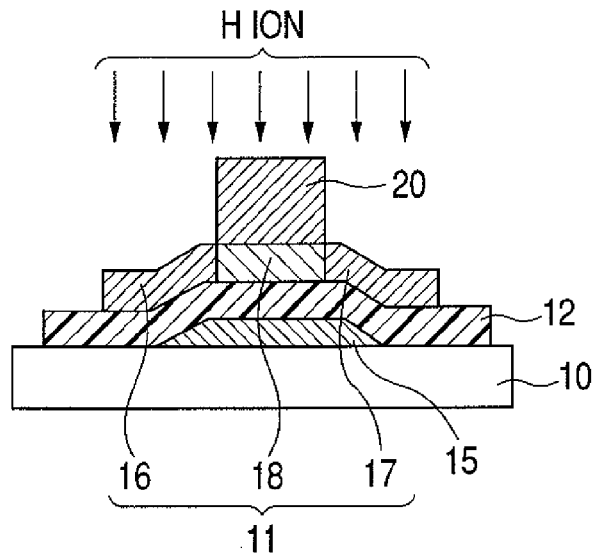

After that, hydrogen was added to the amorphous In—Ga—Zn—O thin film which was the channel layer by hydrogen plasma processing using a plasma processing apparatus. The hydrogen plasma processing can be performed using a parallel-plate type plasma CVD apparatus or an RIE type plasma etching apparatus (FIG. 4B).

A specimen to be processed (substrate obtained after the above step) was stored in the apparatus which was evacuated. After that, a gas containing hydrogen was introduced from a reactive gas introduction port and radio frequency power was introduced into a processing container by a radio frequency (RF) power source, thereby generating plasma. For example, an electrode interval was set to 5 cm, a substrate temperature was set to 100° C., an H$_2$ gas flow rate was set to 500 sccm, and an inner pressure of the chamber was set to 1 Torr. A hydrogen content of the thin film subjected to the hydrogen plasma processing increased and a resistivity thereof reduced.

Figure 4C:
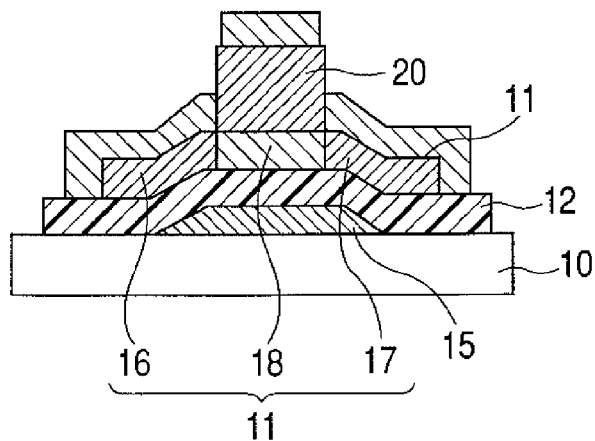

Subsequently, the drain electrode 14 and the source electrode 13 were formed by patterning. Each of the electrodes was made of gold and had a thickness of 30 nm (FIG. 4C).

Figure 4D:
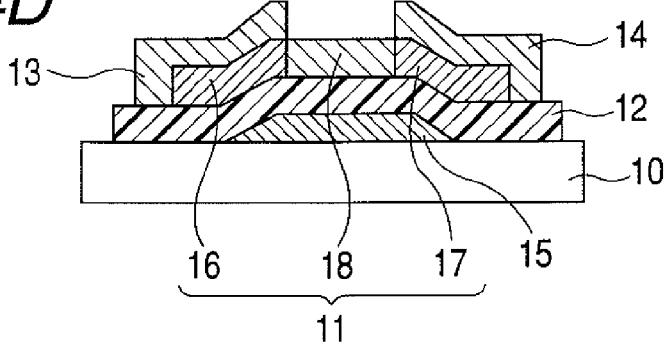

Finally, the mask 20 was etched to form a thin film transistor illustrated in FIG. 4D. A channel length was 50 μm and a channel width was 180 μm.

Comparative Example 2

A specimen not subjected to the above-mentioned hydrogen plasma processing was prepared. That is, the channel layer had a substantially uniform hydrogen concentration over the entire film region thereof and did not include the source part and the drain part. Other structures and manufacturing methods were based on Example 2.

Characteristic Evaluation of TFT Device

The thin film transistor according to this embodiment exhibited a behavior of a typical semiconductor transistor which saturated (pinched off) at Vd=6 V. An on/off ratio of the transistor was 10$^6$ or more and a field effect mobility thereof was approximately 7 cm$^2$ (Vs)$^{-1}$.

When a plurality of devices were produced, a variation in characteristics of the TFTs according to Example 3 was smaller than that of the TFTs according to Comparative Example 2. The hysteresis characteristic and the high-speed operation performance of the devices of Example 3 were also preferable.

In the field effect transistor according to this example, the channel layer (oxide thin film) included the channel part, and the source part and the drain part, each of which had a hydrogen concentration larger than that of the channel part. Therefore, it is expected that stable electrical connection was able to be made between the channel part and each of the source electrode and the drain electrode, thereby improving the uniformity and reliability of the device.

It can be expected that the field effect transistor having a relatively large field effect mobility according to this example be used for, for example, a circuit for operating an organic light emitting diode.

Example 4

This example is an example in which a top-gate TFT device as illustrated in FIG. 5B was formed on a plastic substrate.

A polyethylene terephthalate (PET) film was used as the substrate.

First, a channel layer was formed on the substrate by patterning.

Further, in this example, in formation of the channel layer, a polycrystalline sintered material having a composition of $In_2O_3/ZnO$ having a size of two inches was used as the target (material source), and the applied RF power was 100 W. The total pressure of the atmosphere when the film was formed was 0.4 Pa, where the gas flow ratio was $Ar:O_2=100:2$. The film formation rate was 12 nm/min, and the temperature of the substrate was 25° C.

With regard to the obtained film, when glance angle X-ray diffraction (thin film method, incident angle=0.5 degrees) was carried out approximately on the surface of the film, no clear diffraction peak was detected, which shows that the manufactured In—Zn—O film was an amorphous film. As a result of X-ray fluorescence (XRF) spectroscopy, the compositional ratio of metals was In:Zn=1.1:0.9.

Next, a gate insulating layer and a gate electrode were stacked. The gate insulating layer and the gate electrode are formed to be the same pattern. The gate electrode is a transparent conductive film composed of $In_2O_3:Sn$.

Next, hydrogen plasma processing was performed as in the case of Example 3. The source part 16 and the drain part 17 were formed in self-alignment using the gate electrode as a mask.

A source electrode and a drain electrode were formed by patterning. A transparent conductive film composed of $In_2O_3$: Sn was used as each of the source electrode and the drain electrode and a thickness thereof was 100 nm.

Characteristic Evaluation of TFT Device

The TFT formed on the PET film was measured at a room temperature. An on/off ratio of the transistor is $10^3$ or more. Calculated field effect mobility was approximately 3 cm$^2$ (Vs)$^{-1}$. As in the case of Example 1, the variation in characteristics between devices, the hysteresis characteristic, and the high-speed operation performance were preferable.

While the device formed on the PET film was bent at a curvature radius of 30 mm, the transistor characteristic was measured in the same manner. A large change in transistor characteristic was not observed. The same measurement was performed with visible irradiation. A change in transistor characteristic was not observed. The thin film transistor produced in this embodiment was transparent to visible light and formed on a flexible substrate.

Example 5

In this example, a display device using the field effect transistor illustrated in FIG. 12 will be described. In the field effect transistor, an island of an ITO film serving as the drain electrode was extended from a short side thereof up to 100 µm. A portion corresponding to 90 µm of an extended portion was left to ensure wirings for the source electrode and the gate electrode. Then, the TFT was coated with an insulating layer. A polyimide film was applied onto the insulating layer and subjected to a rubbing step. On the other hand, a plastic substrate in which an ITO film and a polyimide film were formed thereon and a rubbing step was performed was prepared. The plastic substrate was opposed to the substrate on which each field effect transistor was formed at a gap of 5 µm and then nematic liquid crystal was injected thereto. A pair of polarizing plates were provided on both sides of such a structure. When a voltage was applied to the source electrode of the field effect transistor and a voltage applied to the gate electrode thereof was adjusted, light transmittance was changed only in a region of 30 µm×90 µm which was the portion of the island of the ITO film which was extended from the drain electrode. The transmittance was able to be continuously changed by a source-drain voltage during the application of the gate voltage at which the field effect transistor became an on-state. Therefore, a display device using a liquid crystal cell as a display element as illustrated in FIG. 12 was produced.

In another example, a white plastic substrate was used as the substrate on which each TFT was formed. A material of each of the electrodes of the TFT was replaced by gold. The polyimide film and the polarizing plates were omitted. A gap between the white plastic substrate and the transparent plastic substrate was filled with capsules in which particles and a fluid were coated with an insulating coating. In the case of a display device having such a structure, a voltage between the extended drain electrode and the ITO film located thereabove was controlled by the field effect transistor, so that the particles in the capsules move in the longitudinal direction. Therefore, the reflectance of the extend drain region as viewed from the transparent substrate side was able to be controlled for display.

In another example, a plurality of field effect transistor were formed adjacent to one another to produce, for example, a normal current control circuit including four transistors and a capacitor. Therefore, the TFT illustrated in FIG. 11 was able to be used as one of final-stage transistors to drive an EL element. For example, the field effect transistor using the ITO film as the drain electrode was employed. An organic electroluminescence element including a charge injecting layer and a light emitting layer was formed in the region of 30 µm×90 µm which was the portion of the island of the ITO film which was extended from the drain electrode. Thus, the display device using the EL element was able to be produced.

Example 6

Display elements and field effect transistors, each of which corresponds to that in Example 5, were two-dimensionally arranged. For example, 7425×1790 pixels, each of which included the display element such as the liquid crystal cell or the EL element and the field effect transistor in Example 5 and had an area of 30 µm×115 µm, were arranged in a square shape at a pitch of 40 µm in a short-side direction and at a pitch of 120 µm in a long-side direction. Then, 1790 gate wirings passing through the gate electrodes of 7425 field effect transistors in the long-side direction were provided and 7425 signal wirings passing through portions of the source electrodes of 1790 TFTs which protrude from amorphous oxide semiconductor film islands by 5 µm in the short-side direction were provided. The wirings were connected with a gate driver circuit and a source driver circuit. In the case of the liquid crystal display element, when color filters, each of which was equal to the liquid crystal display element in size and aligned therewith, were provided on the surfaces of the devices such that red (R), green (G), and blue (B) filters were repeated in the long-side direction, an active matrix color image display device (approximately 211 ppi and A4 size) was able to be constructed.

In the case of the EL element, among two field effect transistors included in an EL element, the gate electrode of a first field effect transistor was connected with a gate line and the source electrode of a second field effect transistor was connected with signal line. The light emission wavelengths of the EL elements were repeated in the order of R, G, and B lights in the long-side direction. Therefore, a light-emission color image display device having the same resolution was able to be constructed.

A driver circuit for driving an active matrix circuit may be constructed using the TFT according to this embodiment which is identical to the field effect transistor of the pixel or constructed using an existing IC chip.

The field effect transistor according to the present invention can be formed on the flexible material including the PET film. That is, switching can be performed with a bending state. In addition, the field effect transistor is transparent to visible light and infrared light which have a wavelength of 400 nm or more, so that the field effect transistor according to the present invention can be applied as a switching element of an LCD or an organic EL display. The field effect transistor according to the present invention can be widely applied to a flexible display, a see-through display, an IC card, an ID tag, and the like.

According to the field effect transistor of the present invention, the channel layer (oxide film) includes the source part and the drain part which are added with hydrogen or deuterium. Alternatively, the channel layer (oxide film) includes the channel part containing hydrogen or deuterium and the source part and the drain part which have the hydrogen concentration larger than that of the channel part. Therefore, the stable electrical connection can be made between the channel part and each of the source electrode and the drain electrode, thereby improving the uniformity and reliability of the device. The satisfactory electrical connection resistant to trap charges can be realized between each of the source and drain electrode and the channel, so that the field effect transistor having small hysteresis and excellent characteristic stability can be realized.

According to the present invention, when the field effect transistor is to be manufactured, hydrogen is added to the oxide film using the pattern of the gate electrode as the mask. Therefore, the source part and the drain part can be formed in self-alignment with the pattern of the gate electrode, with the result that the positional relationship among the gate, the source, and the drain can be realized with high precision.

This application claims priority from Japanese Patent Application No. 2006-074630 filed Mar. 17, 2006, which is hereby incorporated by reference herein.

The invention claimed is:

1. A field effect transistor, comprising an amorphous oxide film as a semiconductor layer,
    wherein the amorphous oxide film includes a channel part, a source part, and a drain part, and
    wherein a hydrogen concentration of at least one of the source part and the drain part is equal to or larger than $10^{17}/cm^3$, and a concentration of one of hydrogen and deuterium in the source part and the drain part is larger than a concentration of one of hydrogen and deuterium in the channel part.

2. A field effect transistor according to claim 1, wherein the source part and the drain part are disposed in self-alignment with a gate electrode, and have a coplanar structure.

3. A field effect transistor according to claim 1, wherein a resistivity of at least one of the source part and the drain part is $1/10$ or less of a resistivity of the channel part.

4. A field effect transistor according to claim 1, wherein the oxide film is formed of an amorphous oxide represented by:

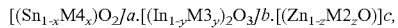

$[(Sn_{1-x}M4_x)O_2]a \cdot [(In_{1-y}M3_y)_2O_3]b \cdot [(Zn_{1-z}M2_zO)]c,$ where $0 \leq x \leq 1$; $0 \leq y \leq 1$; $0 \leq z \leq 1$; $0 \leq a \leq 1$, $0 \leq b \leq 1$, $0 \leq c \leq 1$, and $a+b+c=1$; M4 is a group VI element selected from a group that includes Si, Ge, and Zr smaller in atomic number than Sn; M3 is Lu or a group III element selected from a group that includes B, Al, Ga, and Y smaller in atomic number than In; and M2 is a group II element selected from a group that includes Mg and Ca smaller in atomic number than Zn.

5. A field effect transistor according to claim 1, wherein
    the field effect transistor is incorporated in a display device with a display element that includes an electrode, and
    one of a source part and a drain part of the field effect transistor is electrically connected with the electrode of the display device.

6. A field effect transistor according to claim 5,
    wherein the display element is one of a plurality of display elements, and the field effect transistor is one of a plurality of field effect transistors, and
    wherein the plurality of display elements and the plurality of field effect transistors are two-dimensionally arranged on a substrate.

7. A field effect transistor according to claim 1, wherein a hydrogen concentration of at least one of the source part and the drain part is equal to or larger than $10^{19}/cm^3$.

8. A field effect transistor comprising:
    an amorphous oxide semiconductor layer including a channel region;
    a gate electrode;
    a gate insulator;
    a drain electrode; and
    a source electrode,
    wherein the amorphous oxide semiconductor layer further includes a pair of doped regions adjacent to the source electrode or the drain electrode, each of the doped regions including at least one of hydrogen and deuterium, and
    wherein a hydrogen concentration of at least one of the source electrode and the drain electrode is equal to or larger than $10^{17}/cm^3$ and a concentration of one of hydrogen and deuterium in the doped regions is larger than a concentration of one of hydrogen and deuterium in the channel region.

9. A field effect transistor according to claim 8, wherein a resistivity of at least one of the source electrode and the drain electrode is equal to or smaller than $1/10$ of a resistivity of the channel region.

10. A field effect transistor according to claim 8, wherein a hydrogen concentration of at least one of the source electrode and the drain electrode is equal to or larger than $10^{19}/cm^3$.

* * * * *